(12) United States Patent  
Mathew et al.

(10) Patent No.: US 8,513,066 B2  
(45) Date of Patent: Aug. 20, 2013

(54) METHOD OF MAKING AN INVERTED-T CHANNEL TRANSISTOR

(75) Inventors: Leo Mathew, Austin, TX (US); Rode R. Mora, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1763 days.

(21) Appl. No.: 11/257,973

(22) Filed: Oct. 25, 2005

(65) Prior Publication Data

US 2007/0093010 A1   Apr. 26, 2007

(51) Int. Cl.
*H01L 21/00* (2006.01)
*H01L 21/84* (2006.01)

(52) U.S. Cl.
USPC ...... 438/157; 438/15; 438/283; 257/E21.442; 257/E21.703; 257/E27.112; 257/E29.275

(58) Field of Classification Search
USPC .............. 257/E21.205, E21.442, E21.703, 257/E27.112, E29.275; 438/182, 151, 157, 438/283
See application file for complete search history.

(56) References Cited

U.S. PATENT DOCUMENTS

| | | | |
|---|---|---|---|
| 6,177,706 B1 | 1/2001 | Shindo et al. | |
| 6,252,284 B1 | 6/2001 | Muller et al. | |
| 6,413,802 B1* | 7/2002 | Hu et al. | 438/151 |
| 6,475,890 B1* | 11/2002 | Yu | 438/574 |
| 6,630,712 B2 | 10/2003 | Yu | |
| 6,864,519 B2 | 3/2005 | Yeo et al. | |
| 6,867,450 B2* | 3/2005 | Kito et al. | 257/301 |
| 7,141,856 B2* | 11/2006 | Lee et al. | 257/401 |
| 2004/0222477 A1 | 11/2004 | Aller et al. | |
| 2004/0235300 A1 | 11/2004 | Mathew et al. | |
| 2005/0035391 A1* | 2/2005 | Lee et al. | 257/308 |
| 2005/0127362 A1 | 6/2005 | Zhang et al. | |
| 2005/0156202 A1* | 7/2005 | Rhee et al. | 257/213 |
| 2005/0191795 A1* | 9/2005 | Chidambarrao et al. | 438/142 |
| 2005/0215016 A1* | 9/2005 | Yang et al. | 438/296 |
| 2007/0063261 A1* | 3/2007 | Chen et al. | 257/316 |
| 2007/0076477 A1* | 4/2007 | Hwang et al. | 365/185.08 |
| 2007/0077693 A1* | 4/2007 | Seo et al. | 438/149 |
| 2007/0087507 A1* | 4/2007 | Liu et al. | 438/266 |
| 2007/0111435 A1* | 5/2007 | Kim et al. | 438/253 |
| 2007/0120154 A1* | 5/2007 | Zhu et al. | 257/288 |

FOREIGN PATENT DOCUMENTS

TW   200520222 A   6/2005

OTHER PUBLICATIONS

U.S. Appl. No. 12/251,746, Inventor Byoung W. Min, "Multiple Device Types Including an Inverted T-Channel Transistor and Method Therefor", filing date Oct. 15, 2008, Office Action—Notice of Allowance, mailed Aug. 24, 2012.

* cited by examiner

*Primary Examiner* — Jarrett Stark

(57) ABSTRACT

A method for creating an inverse T field effect transistor is provided. The method includes creating a horizontal active region and a vertical active region on a substrate. The method further comprises forming a sidewall spacer on a first side of the vertical active region and a second side of the vertical active region. The method further includes removing a portion of the horizontal active region, which is not covered by the sidewall spacer. The method further includes removing the sidewall spacer. The method further includes forming a gate dielectric over at least a first part of the horizontal active region and at least a first part of the vertical active region. The method further includes forming a gate electrode over the gate dielectric. The method further includes forming a source region and a drain region over at least a second part of the horizontal active region and at least a second part of the vertical active region.

11 Claims, 6 Drawing Sheets

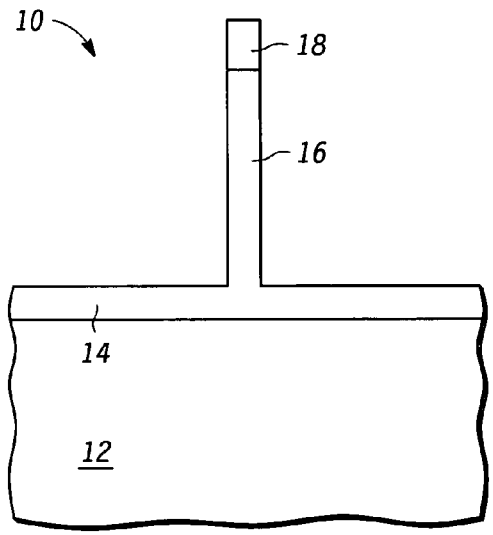
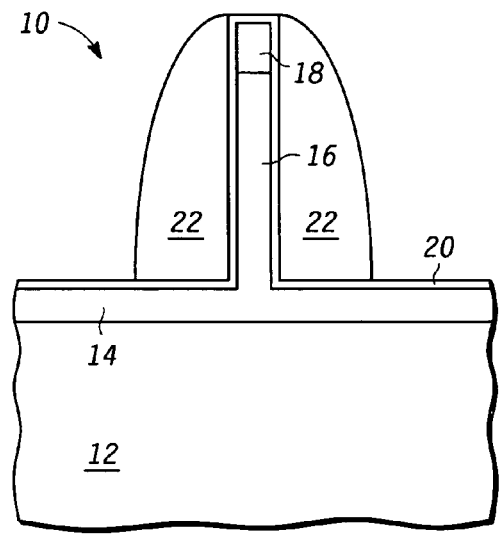
FIG. 1
FIG. 2
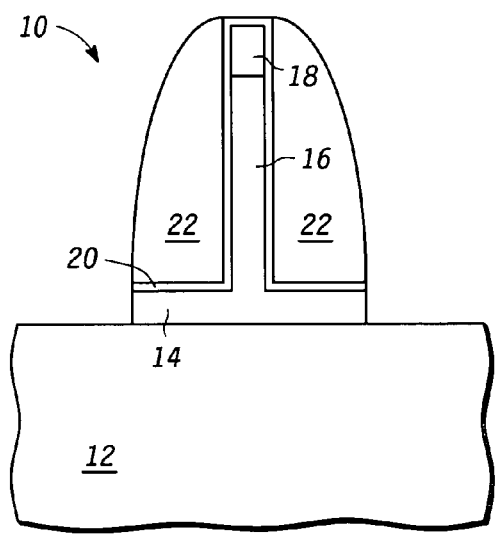
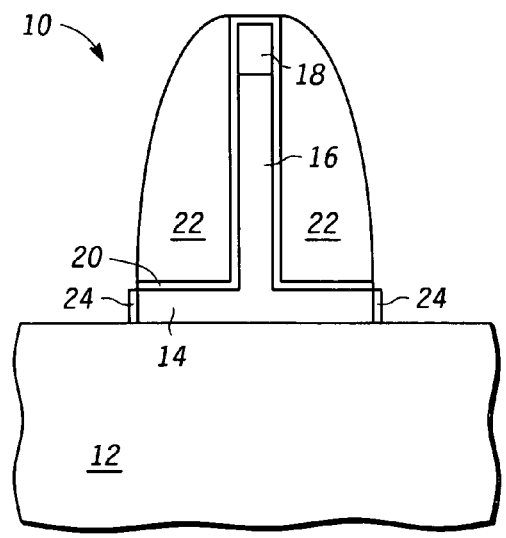
FIG. 3
FIG. 4

METHOD OF MAKING AN INVERTED-T CHANNEL TRANSISTOR

RELATED APPLICATIONS

This application is related to the following:
U.S. patent application Ser. No. 11/047,543, titled "Hybrid-Fet and Its Application As SRAM," by Mathew, assigned to the assignee hereof, and filed Jan. 31, 2005; and
U.S. patent application Ser. No. 11/257,972, titled "Multiple Device Types Including an Inverted-T Channel Transistor and Method Therefor," by Mm et al., assigned to the assignee hereof, and filed even date herewith.

FIELD OF THE INVENTION

This invention relates to integrated circuits, and more particularly, to a method of making inverted-T channel transistors.

BACKGROUND OF THE INVENTION

The use of FinFETs is very attractive for manufacturing for increasing the density and electrical characteristics of MOS transistors. The fin rises above a substrate to function as the channel so that a major portion of the transistor is vertical and not lateral. The channel direction is lateral but in a structure that is above the surface of the substrate. One of the difficulties, however, has been the ability to adjust the current drive of the transistors, especially to increase the current drive. In a lateral transistor, the current drive is easily adjusted by altering the channel width. One way to increase the channel width is to increase the fin height, but that is generally not practical because the fin height is generally selected to the maximum practical height and the difficulties with the methods that are able to alter fin heights. The generally accepted way to increase current drive is to use more than one fin. Thus, an increase in channel width is conveniently available only in increments of the fin height and requires additional space for each additional fin. The space between fins is desirably small but how small is limited by the pitch limitations of the lithography.

Thus, there is a need for a technique for providing a more manufacturable FinFET with adjustable current drive, and preferably without having to be in increments of the fin height.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings:

FIG. 1 is a cross section of a semiconductor device at a stage in a process that is according to an embodiment of the invention;

FIG. 2 is a cross section of the semiconductor device of FIG. 1 at a stage in the process subsequent to that shown in FIG. 1;

FIG. 3 is a cross section of the semiconductor at a stage in the process subsequent to that shown in FIG. 2;

FIG. 4 is a cross section of the semiconductor at a stage in the process subsequent to that shown in FIG. 3;

DETAILED DESCRIPTION OF THE INVENTION

Figure 5:
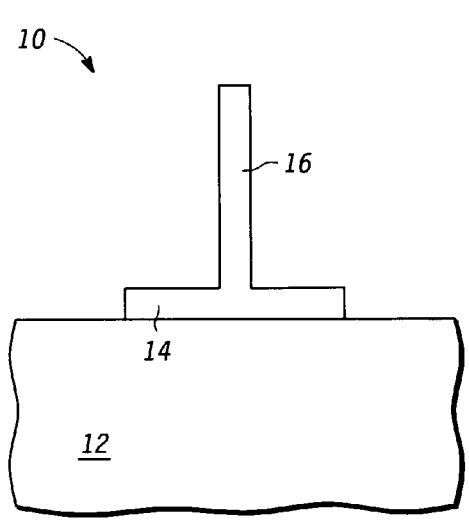
FIG. 5 is a cross section of the semiconductor device at a stage in the process subsequent to that shown in FIG. 4.

In one aspect a FinFET is made with a lateral extension of the channel so as to increase the current drive of the FinFET. A lateral extension extends adjacent to the fin of FinFET along the surface of the substrate. The gate that overlies the fin also overlies the lateral extension. The lateral extension is defined by a sidewall spacer. The fin is formed by an etch that leaves, in addition to the fin, a floor of semiconductor material that is left over the substrate. The sidewall spacer is formed on both sides of the fin to act as a mask in an etch of the floor of the semiconductor material to leave the lateral extension. The lateral extension is selectable within the range of sidewall spacers widths. Using conventional sidewall formation techniques, the width is easily adjustable from 50 to 1000 Angstroms. The lateral extension thus results in increased current drive that is selectable but not limited to increments corresponding to the fin height. This is better understood by reference to the drawings and the following description.

Shown in FIG. 1 is a semiconductor device structure 10 having a substrate 12, a lateral semiconductor layer 14 over substrate 12, a fin 16, and a hard mask 18 overlying fin 16. Substrate 12 provides physical support for transistors. Substrate 12 is preferably silicon oxide but may be another insulating material or composite of materials. The top of substrate 12 should be an electrical insulator. Fin 16 is formed by an etch using hard mask 18 as a mask. Hard mask 18 is preferably silicon nitride but could be another material or a combination of materials that is effective as an etch mask to the semiconductor material. Photoresist is not likely to be sufficient for this due to the relatively large thickness required for the photoresist. In this example, the semiconductor material is preferably silicon but could be another material such as silicon germanium or gallium arsenide. Lateral semiconductor layer 14 is etched back to leave a desired thickness. The thickness chosen is a design choice based on a variety of known criteria generally analogous to those for choosing the semiconductor thickness in an SOI substrate. The surface of substrate 12 can be considered a horizontal surface so that fin 16 will function as a vertical active region. Similarly, lateral semiconductor layer will function as a horizontal active region.

Shown in FIG. 2 is semiconductor device structure 10 after formation of liner 20 over lateral semiconductor layer 20, hard mask 18, and fin 20 and formation of sidewall spacer 22 around fin 16. As is apparent from FIG. 2, sidewall spacer 22 is formed after liner 20. Liner 20 is preferably silicon oxide that is thermally grown but could also be deposited. Sidewall spacer 22 is preferably silicon nitride but could be another material that can function as an etch mask. It does not necessarily have to be an insulator because it will be removed.

Shown in FIG. 3 is semiconductor device 10 after etching lateral semiconductor layer 14 using sidewall spacer 22 as a mask. This is preferably an anisotropic etch such as a chlorine plasma. This etch exposes sides of lateral semiconductor layer 14 that remains.

Shown in FIG. 4 is semiconductor device 10 after growing an oxide layer 24 on the sides of lateral semiconductor layer 14. The purpose is to protect lateral semiconductor layer 14 during the subsequent sidewall spacer removal process.

Shown in FIG. 5 is semiconductor device 10 after removing sidewall spacer 22, oxide layer 24, liner 20, and hard mask 18. All of these removed features are selectable selectively etchable with respect to silicon. The etches are preferably wet etches because there is no need for an anisotropic etch. Dry etches that are isotropic or anistropic may also be used.

Figure 6:
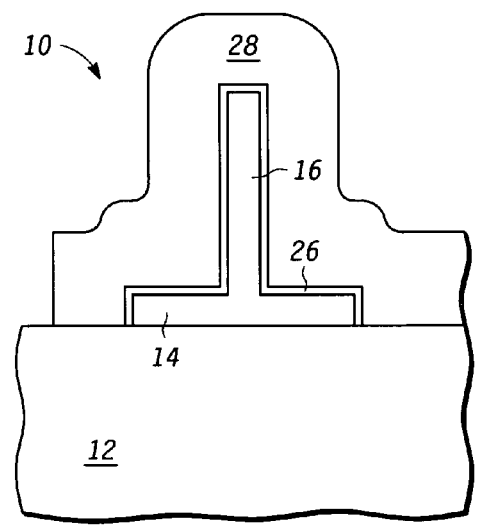
FIG. 6 is a cross section of the semiconductor device at a stage in the process subsequent to that shown in FIG. 5.

Shown in FIG. 6 is semiconductor device 10 after formation of a gate dielectric 26 and a gate 28 on gate dielectric 26. Gate dielectric 26 is preferably formed by a high temperature growth of silicon oxide which is a common approach for forming a gate dielectric. Other gate dielectrics such as high k dielectrics such as hafnium oxide could also be used. Such high k dielectrics would be deposited rather than grown. The source and drain of semiconductor device 10 is formed in conventional fashion for a finFET.

Figure 7:
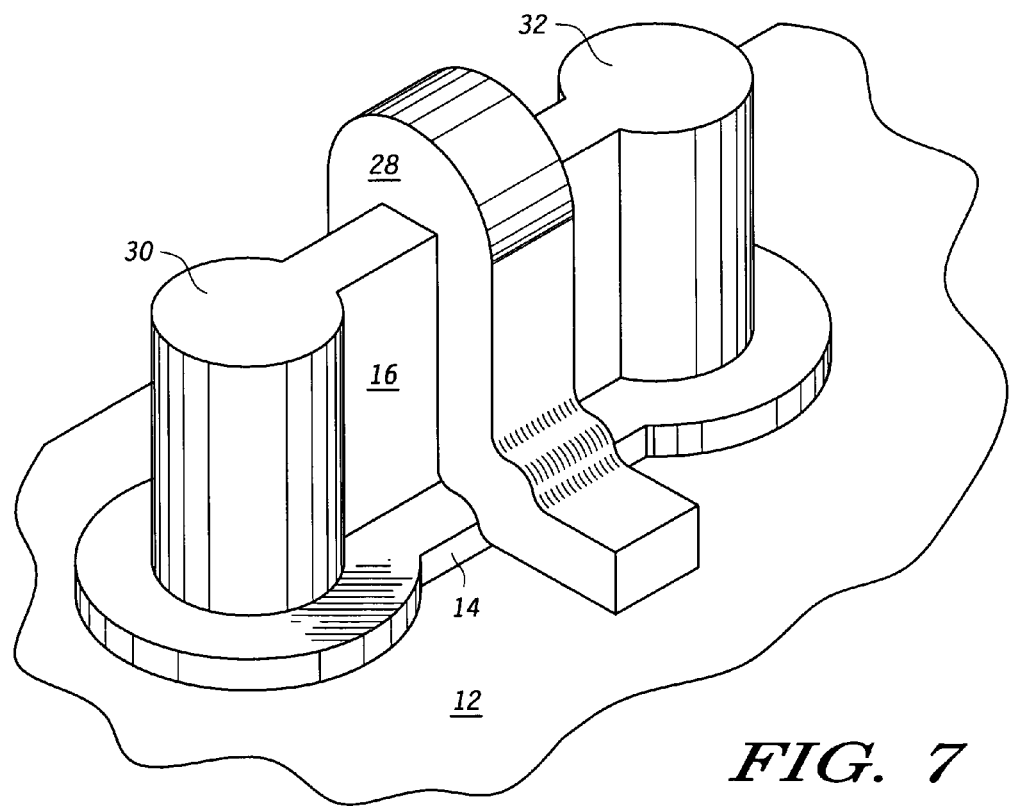
FIG. 7 is a top view of the semiconductor device of FIG. 6.

Shown in FIG. 7 is an orthogonal view of semiconductor device 10 of FIG. 6 that shows a source/drain region 30 on one side of gate 28 that has the conventional elevated portion but in this example also includes a portion of lateral semiconductor layer 14. Similarly a source/drain region 32 that is on the other side gate 28 has the conventional elevated portion but also a portion of lateral semiconductor layer 14. This shows that the horizontal active region aspect of lateral semiconductor layer 14 is for source, drain, and channel. Gate dielectric 26, not separately shown in FIG. 7, covers source/drains 30 and 32, lateral semiconductor layer 14, and fin 16.

FIGS. 6 and 7 thus show a transistor that has both a fin for a channel and a lateral portion as a channel. The lateral portion is adjustable by adjusting the width of sidewall spacer 22. The greater the width of lateral semiconductor layer 14 that remains after the etch, the greater the current drive capability of the resulting transistor. The resulting transistor thus has a greater gain than just a single fin device but does not require all of the area over substrate 12 that would be required by adding an additional fin. Further the gain and the consequent current drive is selectable within any of the available sidewall spacer widths. In effect any gain is selectable because additional fins can still be added with only a certain one or certain ones having a lateral semiconductor layer with a selected width.

Figure 8:
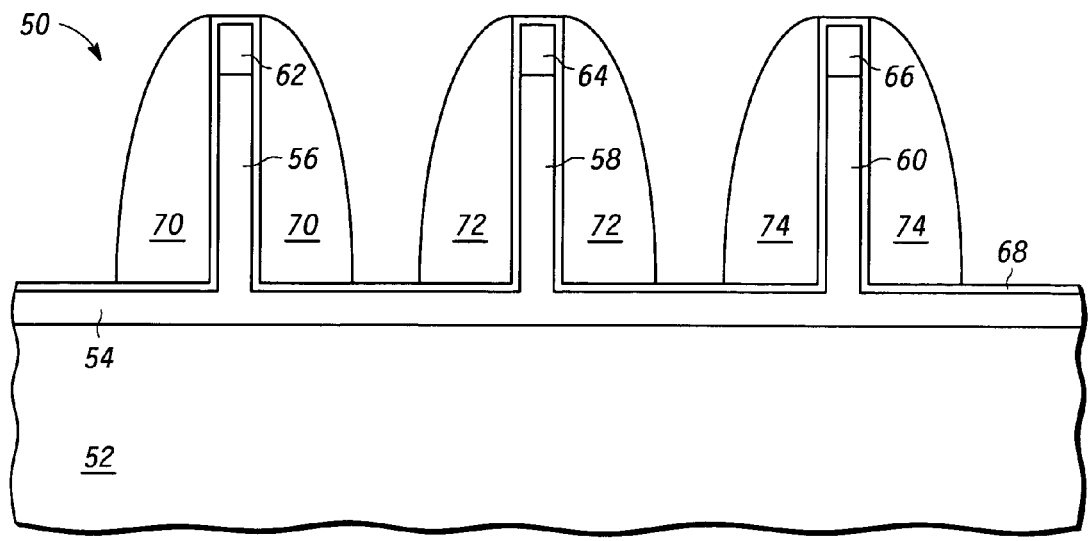
FIG. 8 is a cross section of a semiconductor device structure at a stage in a process that is according to an alternative embodiment of the invention.

Shown in FIG. 8 is semiconductor device 50 having a substrate 52, a lateral semiconductor layer 54; a fin 56; a fin 58; a fin 60; a hard mask 62 on fin 56; a hard mask 64 on fin 58; a hard mask 66 on fin 60; a liner 68 over fins 56, 58, and 60, lateral semiconductor layer 54, and hard masks 62, 64, and 66; a sidewall spacer 70 around fin 56; a sidewall spacer 72 around fin 58, and a sidewall spacer 74 around fin 60. The preferred materials and options for semiconductor device 50 of FIG. 8 are the same as described for semiconductor device 10. In effect at this point in the processing, there are three devices that are the same as shown in FIG. 2.

Figure 9:
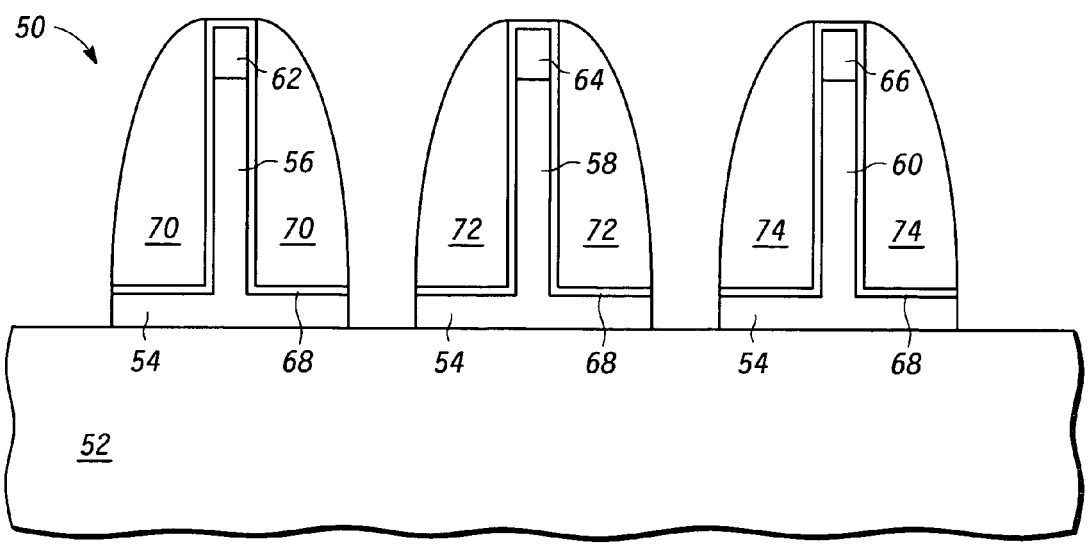
FIG. 9 is a cross section of the semiconductor device structure of FIG. 8 at a subsequent stage in the process.

Shown in FIG. 9 is a semiconductor device structure 50 after performing an etch using sidewall spacers 70, 72, and 74 as masks analogous to the transition from FIG. 2 to FIG. 3. This results in three device structures each having a separate portion of lateral semiconductor layer 54. Although the etch separates the three device structures, a photoresist mask can be used to prevent the etch of lateral semiconductor layer 54 in other locations not shown. For example, the area where lateral semiconductor layer 54 contacts source/drain regions may be an area that will contact a source/drain region of another transistor. In that area, a photoresist mask can be applied to maintain that contact. A subsequent silicide treatment is effective for ensuring an effective electrical contact between the joined source/drains.

Figure 10:
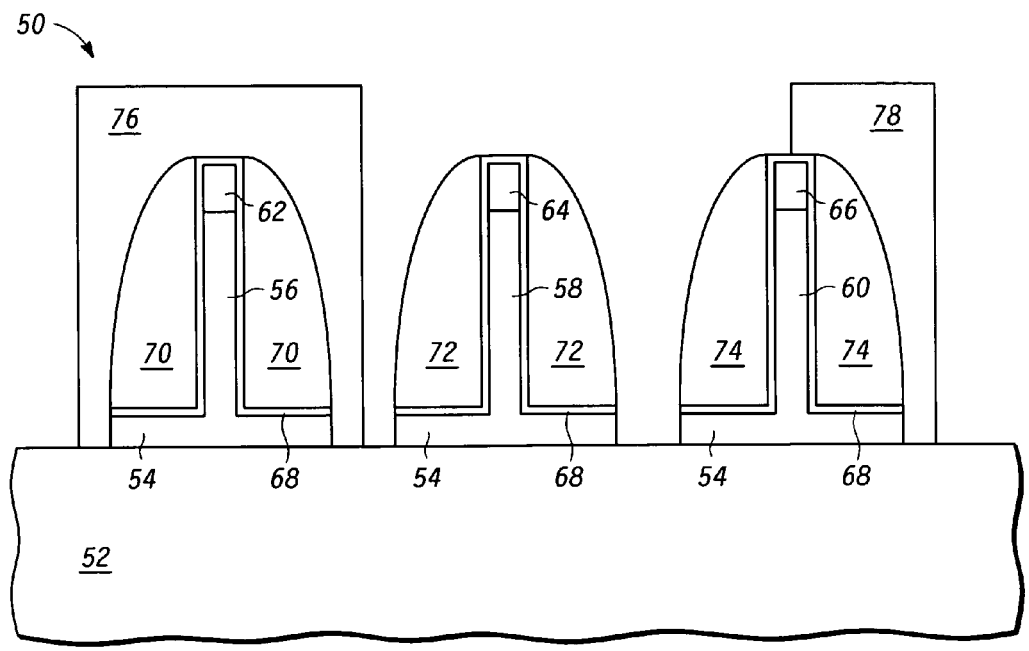
FIG. 10 is a cross section of the semiconductor device structure of FIG. 9 at a subsequent stage in the process.

Shown in FIG. 10 is semiconductor device structure 10 after forming a mask 76 and a mask 78. Mask 76 is formed over fin 56 and lateral semiconductor layer 54 thereunder so that sidewall spacer 70 on both sides of fin 56 are covered. Mask 78 is from fin 60 to one side of fin 60 extending over lateral semiconductor layer 54 and sidewall spacer 74 on the covered side. Thus sidewall spacer 74 on the other side of fin 60 is exposed. There is no mask over fin 58 so that sidewall spacer 72 is exposed. Fin 60 is preferably about 200 Angstroms so that alignment thereto is repeatably attainable.

Figure 11:
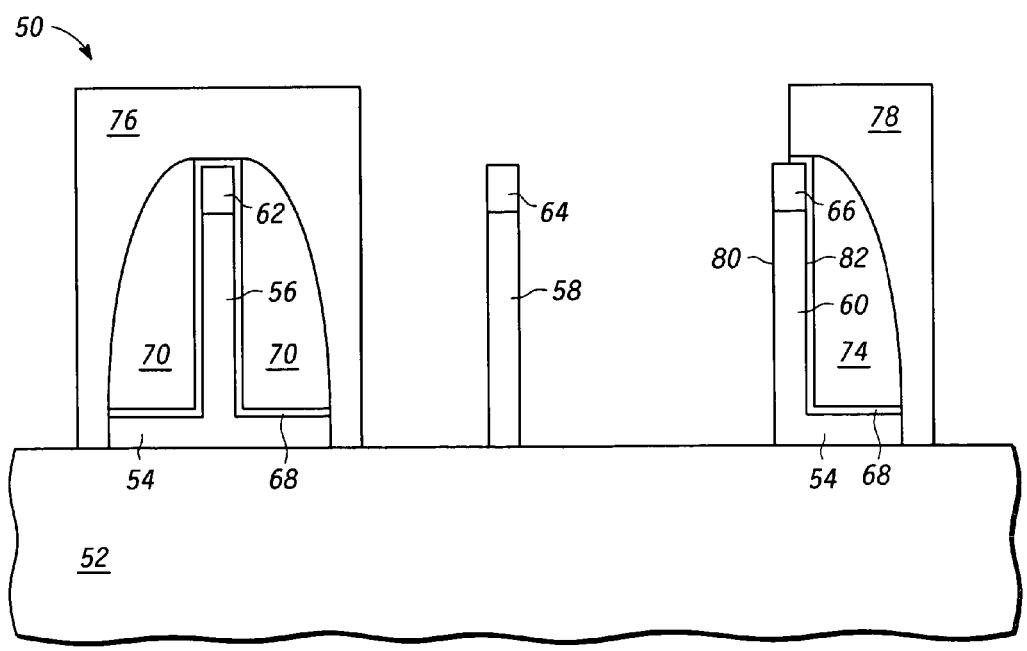
FIG. 11 is a cross section of the semiconductor device structure of FIG. 10 at a subsequent stage in the process.

Shown in FIG. 11 is shown semiconductor device structure 40 after removing the sidewall spacer 72 and a portion of sidewall spacer 74 on a side 80 of fin 60. With sidewall spacer 72 removed, liner 68 is then removed and lateral semiconductor layer 54 that was under sidewall spacer 72 is then removed by etching. Similarly, liner 68 under the portion of sidewall spacer adjacent to side 80 is removed and lateral semiconductor layer 54 under the portion of sidewall spacer adjacent to side 80 is removed. Masks 76 and 80 are maintained during the etch of liner 68 and lateral semiconductor layer 54 because there may be other masks in other locations not shown in FIG. 11 that are protecting against an etch of a portion of lateral semiconductor layer 54.

Figure 12:
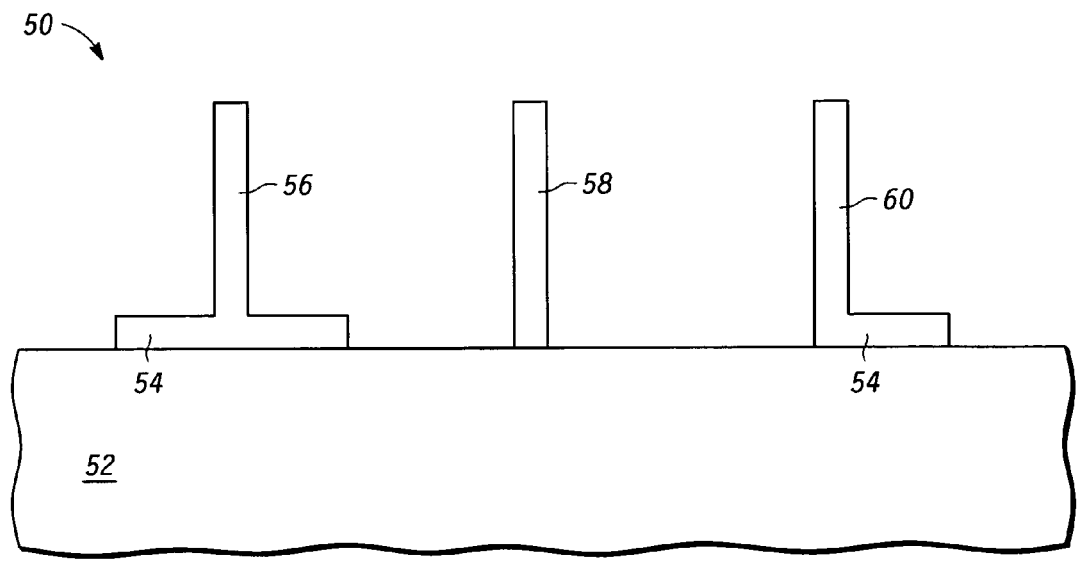
FIG. 12 is a cross section of a semiconductor device structure of FIG. 111 at a subsequent stage in the process.

Shown in FIG. 12 is a semiconductor device structure 50 after removal of sidewall spacer 70, sidewall spacer 74 that remained, and liner 68. Fins 56, 58, and 60 and lateral semiconductor layer 54 that remains are thus exposed.

Figure 13:
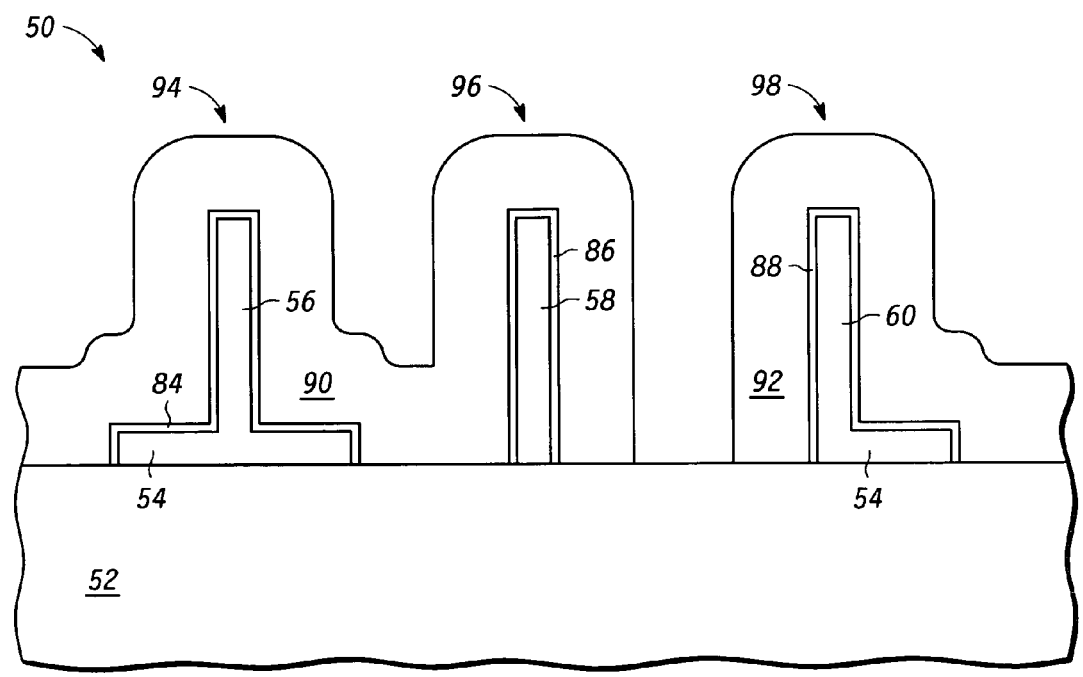
FIG. 13 is a cross section of the semiconductor device structure at a subsequent stage in the process.

Shown in FIG. 13 is semiconductor device structure 50 after growing gate dielectrics 84, 86, and 88 and forming gates 90 and 92. This results in transistors 94, 96, and 98. Transistor 94 uses fin 56 as a vertical active region and lateral semiconductor layer 54 that is connected to fin 56 results in an inverted-T channel transistor analogous to semiconductor device 10 of FIGS. 6 and 7. Gate dielectric 84 coats the semiconductor structure of transistor 94. Gate dielectric 86 coats fin 58. Gate dielectric 88 coats the semiconductor structure of transistor 98. Transistor 96 is has the resulting structure of a conventional FinFET made by a process integrated with the formation of transistors 94 and 96. Transistors 94 and 96 share the same gate layer 90 that serves as the gates for both. Transistor 98 has a horizontal active region half that of transistor 94. This is a particularly convenient combination for use as an SRAM cell.

Figure 14:
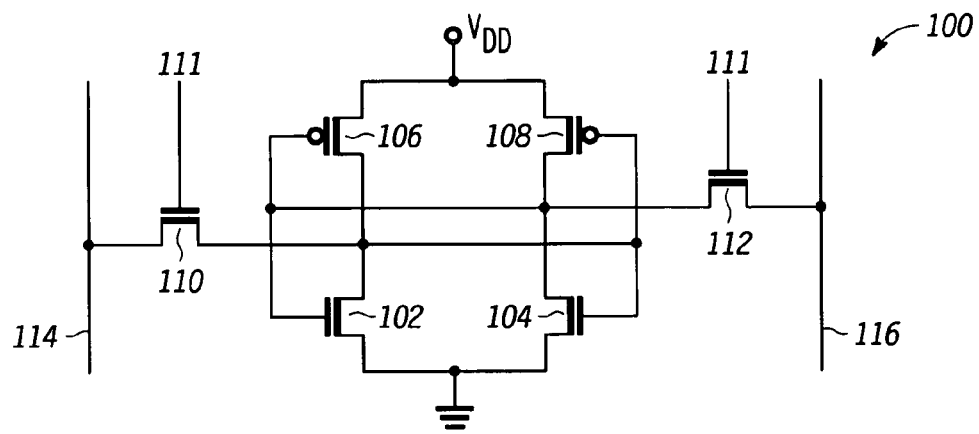
FIG. 14 is a circuit diagram of a 6 transistor SRAM cell that the process of FIGS. 8-13 is useful in making.

Shown in FIG. 14 is a circuit diagram of a SRAM cell 100 using transistors made using transistors like transistors 94, 96, and 98. SRAM cell 100 comprises N channel transistors 102, 104, 110, and 112 and P channel transistors 106 and 108. The circuit configuration is conventional. Transistors 102 and 104 are pull-down transistors, transistors 106 and 108 are pull-up transistors, and transistors 110 and 112 are pass transistors. Transistors 102 and 106 are coupled together as one storage node, transistors 104 and 108 are coupled together at another storage node. Each pair of transistors sharing a storage node form an inverter. The storage portion of SRAM cell 100, where a bit is maintained, comprises the two inverters being cross-coupled in a latching arrangement. Pass transistors 110 and 112 are both connected to a word line 111 and, when word line 111 is enabled, connect bit lines 114 and 116 to the storage portion of SRAM cell 100. Transistors 110 and 112 are made to be like transistor 98 of FIG. 13. Transistors 106 and 108 are made to be like transistor 96. Transistors 102 and 104 are made to be like transistor 94.

Figure 15:
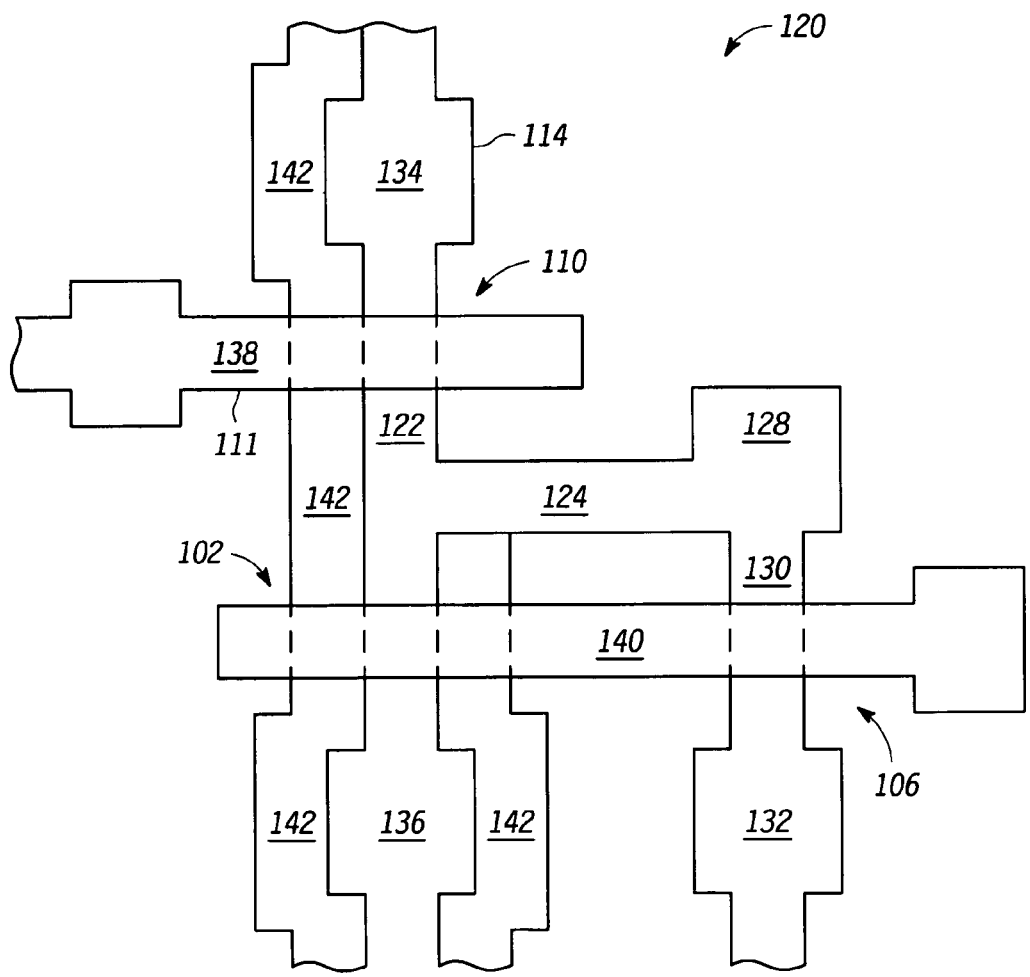
FIG. 15 is a top view of a portion of the 6 transistor SRAM cell of FIG. 14 that the process of FIG. 8-13 is useful in making.

Shown in FIG. 15 is a top view of a portion 120 of SRAM cell 100 showing transistors 102, 106, and 110 connected as shown in the circuit diagram of FIG. 14. Portion 120 comprises fins 122, 124, and 130. Fins 122 and 130 are parallel. Fin 124 has one end connected to fin 122 and another end connected to an end of fin 130 where there is a contact region 128. Contact regions for fins, in this example, are the same height as the fin but wider. A gate electrode 138, analogous to gate electrode 92 of FIG. 13, passes over fin 122 between a contact region 134 and the location where fin 124 joins fin 122. This gate electrode is connected to word line 111 which runs in a metal line in an interconnect layer above portion 120 so is not shown in FIG. 15. At the location where gate electrode 138 passes over fin 122, a lateral semiconductor layer 142 extends laterally from fin 122 at the bottom of fin 122. Lateral semiconductor layer 142 is analogous to lateral semiconductor layer 54 that adjoins fin 60 in FIG. 13. Thus, fin 122, gate electrode 138, and lateral semiconductor layer 142 are used to form transistor 110 to be like transistor 98. Contact region 134 is used to make a contact to bit line 114 as shown in FIG. 14. Bit line 114 runs as a metal line in an interconnect layer above portion 120 so is not shown in FIG. 15.

Transistors 102 and 106 are constructed similarly to achieve the types of transistors 94 and 96, respectively. Fin 122 in the area below fin 124 has lateral semiconductor layer 142 on both sides. Fin 130, on the other hand, does not have lateral semiconductor layer 142 adjoining it. A gate electrode 140, analogous to gate electrode 90 of FIG. 13, passes over fins 130 and 122. Gate electrode 140 passes over fin 122 in a location between fin 124 and a contact region 136 so it passes over lateral semiconductor layer 142 on both sides of fin 122. Gate electrode 140 passes over fin 130 between contact region 128 and a contact region 132. Gate electrode 140 passing over fin 122 and lateral semiconductor layer 142 on both sides of fin 122, results in a transistor structure like transistor 94 in FIG. 13. Gate electrode 140 passing over fin 130, which does not have a lateral semiconductor layer, results in a transistor structure like transistor 96 in FIG. 13. Contact region 136 is used to contact ground potential. Contact 132 is used to contact the positive power supply, VDD. Contact 128 is used to contact the gates of transistors 104 and 108. Fin 124 provides the contact between the drains of transistors 102 and 106. Thus, portion 120 efficiently provide the circuit connection for transistors 102, 106, and 110 of FIG. 14. Further this layout can be propagated to form an SRAM layout using symmetrical representations of portion 120.

Portion 120 is one use of the three transistor types shown in FIG. 13 to avoid having to use additional fins to achieve additional current drive. In the example of portion 120, the N channel pass transistors 106 and 108 are increased in current drive from that of just a single fin by adding a lateral semiconductor layer on just one side of the fin. Generally it is considered desirable for the pull-down transistors 102 and 104 to have more current drive than the pass transistors. If the pass transistors need to have even less current drive in comparison to the pull-downs, the lateral semiconductor layer can be removed. Similarly, if the P channel pull-up transistors need more current drive, a lateral semiconductor layer can be added to the P channel fin on one side or even both sides. The three transistor types of FIG. 13 thus give flexibility in adjusting the current drives of the three transistor types (pull-down, pull-up, and pass) that make up an SRAM cell to achieve the desired ratios of those current drives. The flexibility of the three transistor types of FIG. 13 may alleviate the need for putting fins in parallel but even if the current drive requirements are so high as to require multiple fins, the three transistors types of FIG. 13 can be used in conjunction with transistors requiring multiple fins to reduce the number of fins that need to be added and/or provide current drive ratios that are closer to the ideal ratios.

Various other changes and modifications to the embodiments herein chosen for purposes of illustration will readily occur to those skilled in the art. For example, a particular benefit was shown for SRAM cells, but other circuit types may also benefit. To the extent that such modifications and variations do not depart from the spirit of the invention, they are intended to be included within the scope thereof which is assessed only by a fair interpretation of the following claims.

What is claimed is:

1. A method for creating an inverse T field effect transistor, comprising:
    creating a horizontal semiconductor region and a vertical active region on a substrate, wherein the horizontal semiconductor region is on a top surface of a substrate, wherein the top surface of the substrate is an electrical insulator;
    forming a sidewall spacer on a first side of the vertical active region and over a first part of the horizontal semiconductor region adjacent to the first side and leave an exposed first portion of the horizontal semiconductor region adjacent to the first part, and on a second side of the vertical active region and over a second part of the horizontal semiconductor region adjacent to the second side and leave an exposed second portion of the horizontal active region adjacent to the second part, wherein the first part is a first horizontal active region and the second part is a second horizontal active region;
    etching away the first portion and the second portion of the horizontal active region through to the top surface of the substrate to leave the first horizontal active region and the second horizontal active region;
    removing the sidewall spacer;
    forming a gate dielectric over the first horizontal active region, the second horizontal active region, and at least a first part of the vertical active region;
    forming a gate electrode over the gate dielectric; and
    forming a source region and a drain region in portions of the first and second horizontal active regions and the vertical active region.

2. The method of claim 1 further comprising forming a liner on the first horizontal active region, the second horizontal active region, and the vertical active region.

3. The method of claim 2, wherein the liner is used as an etch-stop layer for forming the sidewall spacer.

4. The method of claim 2, wherein the liner comprises silicon oxide.

5. The method of claim 1, wherein the sidewall spacer comprises one of silicon nitride or silicon oxide.

6. The method of claim 1 further comprising, after the step of etching, oxidizing a to portion of the first and second horizontal active regions.

7. The method of claim 1, wherein the sidewall spacer has a base, which is substantially equal in terms of its width on each side of the vertical active region.

8. The method of claim 1, wherein removing the sidewall spacer comprises using a wet-etch process.

9. The method of claim 1, wherein the top surface of the substrate comprises silicon oxide.

10. The method of claim 1, wherein a base width of the sidewall spacer is in a range from 10 Angstroms to 1000 Angstroms.

11. The method of claim 1, wherein a height of the horizontal first and second horizontal active regions is smaller than a width of the vertical active region.

* * * * *